(12) United States Patent
Weinberg

(10) Patent No.: US 8,836,329 B2
(45) Date of Patent: Sep. 16, 2014

(54) ULTRA-FAST PRE-POLARIZING MAGNETIC RESONANCE IMAGING METHOD AND SYSTEM

(75) Inventor: Irving Weinberg, Bethesda, MD (US)

(73) Assignee: Weinberg Medical Physics LLC, Bethesda, MD (US)

( * ) Notice: Subject to any disclaimer, the term of this patent is extended or adjusted under 35 U.S.C. 154(b) by 979 days.

(21) Appl. No.: 12/888,580

(22) Filed: Sep. 23, 2010

(65) Prior Publication Data

US 2011/0068791 A1 Mar. 24, 2011

Related U.S. Application Data

(63) Continuation-in-part of application No. 12/488,105, filed on Jun. 19, 2009, now Pat. No. 8,154,286.

(60) Provisional application No. 61/074,397, filed on Jun. 20, 2008.

(51) Int. Cl.
| | |
|---|---|
| *G01V 3/00* | (2006.01) |
| *G01R 33/385* | (2006.01) |
| *G01R 33/44* | (2006.01) |
| *G01R 33/28* | (2006.01) |

(52) U.S. Cl.
CPC .......... *G01R 33/3852* (2013.01); *G01R 33/288* (2013.01); *G01R 33/445* (2013.01)
USPC ........................................................ 324/307

(58) Field of Classification Search
USPC ............................................... 324/300–322
See application file for complete search history.

(56) References Cited

U.S. PATENT DOCUMENTS

| | | | |
|---|---|---|---|
| 5,860,921 A * | 1/1999 | Ma et al. | 600/410 |
| 6,373,250 B1 * | 4/2002 | Tsoref et al. | 324/309 |
| 6,492,809 B1 * | 12/2002 | Speier et al. | 324/303 |
| 6,520,903 B1 * | 2/2003 | Yamashiro | 600/9 |
| 6,528,997 B2 * | 3/2003 | Zhong et al. | 324/307 |
| 6,566,874 B1 * | 5/2003 | Speier et al. | 324/303 |
| 6,844,728 B2 * | 1/2005 | Speier et al. | 324/303 |
| 8,154,286 B2 * | 4/2012 | Weinberg | 324/309 |
| 8,466,680 B2 * | 6/2013 | Weinberg et al. | 324/318 |
| 2004/0189297 A1 * | 9/2004 | Bock et al. | 324/307 |
| 2008/0262339 A1 * | 10/2008 | Garwood et al. | 600/413 |
| 2009/0315560 A1 * | 12/2009 | Weinberg | 324/309 |
| 2011/0068791 A1 * | 3/2011 | Weinberg | 324/309 |
| 2011/0089947 A1 * | 4/2011 | Weinberg et al. | 324/309 |
| 2011/0221438 A1 * | 9/2011 | Goodwill et al. | 324/301 |
| 2012/0223711 A1 * | 9/2012 | Weinberg | 324/309 |
| 2012/0326722 A1 * | 12/2012 | Weinberg et al. | 324/316 |
| 2013/0046169 A1 * | 2/2013 | Weinberg et al. | 600/411 |
| 2013/0257428 A1 * | 10/2013 | Weinberg | 324/309 |
| 2013/0271136 A1 * | 10/2013 | Weinberg et al. | 324/309 |
| 2013/0296631 A1 * | 11/2013 | Weinberg et al. | 600/12 |

\* cited by examiner

*Primary Examiner* — Dixomara Vargas
(74) *Attorney, Agent, or Firm* — Barnes & Thornburg LLP

(57) ABSTRACT

A method and apparatus generate a pre-polarizing magnetic field having a rise-time of less than about 10 microseconds and/or a fall-time of less than about 10 microseconds for immersing a tissue sample in the pre-polarized magnetic field to polarize an animal tissue sample whereby magnetic gradient and/or radio-frequency pulses may be applied in order to read out the location and/or state of the spins. A method and apparatus deliver such magnetic fields through planar coils. A method and apparatus enable guidance and propulsion of magnetic fluids.

24 Claims, 4 Drawing Sheets

ULTRA-FAST PRE-POLARIZING MAGNETIC RESONANCE IMAGING METHOD AND SYSTEM

CROSS-REFERENCE TO RELATED APPLICATIONS

This application is a continuation-in-part of U.S. patent application Ser. No. 12/488,105 filed Jun. 19, 2009, which relies for priority on U.S. Provisional Application No. 61/074,397 filed Jun. 20, 2008, the contents of which are incorporated herein by reference.

FIELD OF THE DISCLOSED EMBODIMENTS

The present invention concerns an apparatus and a method for improving magnetic resonance imaging and spectroscopy of living tissues or inanimate objects.

BACKGROUND

Conventionally, Magnetic Resonance Imaging (MRI) has been used to visualize characteristics of soft tissue of the human body and to diagnose diseased tissue.

Pre-polarized Magnetic Resonance Imaging (PMRI) has been promoted as a method of constructing low-cost imaging systems. The basic principle of the PMRI method is to immerse or otherwise subject an object of interest in a transient magnetic field. The purpose of said immersion is to polarize and/or align spins in the object along the direction of the transient magnetic field. For example, living animal tissue is largely composed of water molecules containing hydrogen nuclei or protons. When such tissue is immersed in a magnetic field, some of the protons align with the direction of the field. This alignment may also occur for certain inanimate objects, for example, petroleum deposits in rock samples. A transient magnetic field takes the place of (or can augment) the static magnetic field (that is typically employed in conventional MRI systems).

In PRMI, following the application of the transient magnetic field, a set of magnetic gradient and/or radio-frequency pulses are typically applied, in order to read out the location and/or state of the spins. For example, a radio frequency transmitter may be used to provide an electromagnetic field whereby photons of this field having resonance frequency, flip the spin of the aligned protons. After the transient magnetic field is turned off or reduced in magnitude, the protons decay to the original spin-down state and the difference in energy between the two states is released as a photon. These photons produce a signal which can be detected by a scanner.

It is conventionally known that application of a high transient magnetic field during the polarization portion of the pulse sequence results in an improved signal (see for example, A Macovski, S Conolly: "Novel Approaches to Low-Cost MRI", in Magnetic Resonance in Medicine 30:221-230, the subject matter of which is incorporated herein by reference in its entirety) because more spins are aligned; as a result, the application of this field subsequently results in output of a more significant signal as they return to their equilibrium state.

Reducing the fall-time of the transient magnetic field may be also advantageous, because the magnetization (due to the aligned polarized spins) does not have a chance to decay much before the readout sequence is completed. Speed of the overall pulse sequence is important in order to reduce overall scan time.

Furthermore, reducing the overall scan time may be desirable for economic reasons (for example, in order to study more patients in a fixed period of time) and/or physiological considerations (for example, to reduce the effect of breathing or cardiac motion).

The principle of PMRI has been applied to anatomical studies, as well as to explosives detection (see, for example, M Espy, M Flynn, J Gomez, C Hanson, R Kraus, P Magnelind, K Maskaly, A Matlashov, S Newman, T Owens, M Peters, H Sandin, I Savukov, L Schultz, A Urbaitis, P Volegoc, V Zotev: in "Ultra-Low Field MRI for the Detection of Liquid Explosives Using SQUIDs", published in IEEE/CSC & ESAS European Superconductivity New Forum 8:1-12 (2009), the subject matter of which is incorporated herein by reference in its entirety).

Additionally, a variation of the pre-polarizing principle is denoted as field-cycling MRI, in which the magnitude of the transient magnetic field is varied, in order to provide information about magnetic decay properties of the object of interest (see, for example, K M Gilbert, W B Handler, T J Scholl, J W Odegaard, B A Chronik, in "Design of field-cycled magnetic resonance systems for small animal imaging", published in Physics of Medicine and Biology 51:2825-2841 (2006) the subject matter of which is incorporated herein by reference in its entirety).

Furthermore, PMRI systems have been proposed as methods of examining neuronal activity in vivo (see, for example, R S Wijesinghe and B J Roth, in "Detection of Peripheral Nerve and Skeletal Muscle Action Currents Using Magnetic Resonance Imaging", published in the Annals of Biomedical Engineering 37(11):2402-2406 (2009), the subject matter of which is incorporated herein by reference in its entirety).

SUMMARY

In accordance with disclosed embodiments of this disclosure, an apparatus and method are provided for creating strong pulsed currents to drive magnetic fields with short rise- and fall-times (see IN Weinberg, inventor: "Apparatus and Method for Decreasing Bio-Effects of Magnetic Gradient Fields", PCT/US2009/047960, the subject matter of which is incorporated herein by reference in its entirety). This disclosure relates primarily to the generation of magnetic gradients by the apparatus and method, in which the configuration of circuits and switches is used to drive gradient coil configurations (such as opposed Helmholtz pairs).

In the description of the embodiments, the term "coil" is used to imply a set of conductors arranged to generate a magnetic field, whether the conductors are in a solenoidal configuration or in some other configuration.

Circuits and/or switches as previously disclosed by I N Weinberg (PCT/US2009/047960) can also be used to drive magnetic fields with solenoids, Golay coils, or non-opposed Helmholtz coil pairs, or other coils. Examples of such alternative coil configurations include planar configurations of magnetic field generation coils, which can reduce the footprint of an MRI scanner (see, for example, B Aksei, L Marinelli, B D Collick, C Von Morze, P A Bottomley, C J Hardy, in "Local Planar Gradients With Order-of-Magnitude Strength and Speed Advantage", published in Magnetic Resonance in Medicine 58(1):134-143 (2007), the subject matter of which is incorporated herein by reference in its entirety) and implement cost-effective imaging of small body parts (e.g., breast, foot, knee) or samples. The cost-effectiveness of such alternative coil configurations (especially when used with the previously described apparatus and method of IN Weinberg's application PCT/US2009/047960) is realized as a result, in part, of the ability to suffuse a relatively small volume with magnetic energy, thereby reducing power and/or cooling requirements.

The present disclosure embodiments involve application of fast switches and methods, as previously disclosed by IN Weinberg, to drive solenoids and/or coils for use in fast-cycling and/or pre-polarized magnetic resonance imaging and/or spectroscopy systems. Present disclosure embodiments also include the application of fast switches and methods to drive planar gradient coils. In both of these embodiments, magnetic fields of very high magnitudes may be applied with minimal or no bio-effects, due to the very short rise- and/or fall-times possible with the disclosed methods. Such high gradients may be used to propel, repel, or contain magnetizable or magnetic particles in the body (heretofore denoted as "magnetic particles").

It is known that magnetic particles can be bound, either permanently or temporarily, to other agents with biochemical specificity or with therapeutic effect. The short durations of the pulsed magnetic fields may be used to monitor the progress of the magnetic particles in the body.

The currently disclosed embodiments include the use of fast switches and methods, as previously disclosed by IN Weinberg, to eliminate or reduce the bio-effects during the application of the pre-polarizing magnetic pulse, and/or during subsequent (e.g., readout) magnetic pulses. A potential advantage of fast readout pulses, when used in combination with pre-polarizing pulses, may be that the spins are read out during the readout sequence while the magnetization from the pre-polarizing pulse is still in effect.

The currently disclosed embodiment may reduce acoustic noise as compared to conventional MRI systems because of the more rapid pulse sequences resulting in sounds at higher frequencies than are produced by conventional MRI systems. Since the human ear is less sensitive to high frequencies than to low frequencies (see, for example, Acoustics-Normal equal-loudness-level contours. Internal Organization for Standardization (ISO) 226:203, the subject matter of which is incorporated herein by reference in its entirety), the net effect is a perceived reduction in acoustic noise.

It is an object of the currently disclosed embodiments to provide a method and apparatus for improving magnetic resonance imaging.

It is another object of the currently disclosed embodiments to provide a method and apparatus for improving magnetic resonance imaging by generating a pre-polarizing magnetic field having at least one of a rise-time of less than 10 microseconds and a fall time of less than 10 microseconds; and immersing a tissue sample in the pre-polarized magnetic field to polarize the tissue sample.

It is further object of the currently disclosed embodiments that the pre-polarizing magnetic pulse has a rise-time of less than 10 microseconds and a fall time of less than 10 microseconds.

A further object of the currently disclosed embodiments is that at least one magnetic pulse following a pre-polarizing magnetic pulse has a rise-time of less than 10 microseconds and a fall time of less than 10 microseconds.

Another object of the currently disclosed embodiments generates a first magnetic pulse having at least one of a rise-time of less than 10 microseconds and a fall time of less than 10 microseconds to create a first magnetic field, immerses a tissue sample in the first magnetic field to polarize the tissue sample, and generates a second magnetic field to read out characteristics of the tissue sample.

A further object of the currently disclosed embodiments is that the first magnetic pulse may fall to a level that is non-zero, in order to act as an evolution field during the application of subsequent magnetic pulses, in which at least one of the subsequent magnetic pulses has a rise-time of less than 10 microseconds and/or a fall time of less than 10 microseconds.

A further object of the currently disclosed embodiments is that the first magnetic pulse may remain in order to act as an evolution field during the application of subsequent magnetic pulses, in which at least one of the subsequent magnetic pulses has a rise-time of less than 10 microseconds and/or a fall time of less than 10 microseconds.

Another object of the currently disclosed embodiments is that the first magnetic pulse has a magnitude that is stronger than that of subsequent magnetic pulses.

The short rise- and fall-times of subsequent magnetic pulses may be advantageous in that the duration of the pulse sequence may be reduced, thereby reducing the need to cool the coil or coils responsible for generating the magnetic pulses and permitting the characterization or description of short-duration processes or of objects in rapid motion or vibration.

A further object of the currently disclosed embodiments is that the first magnetic pulse has a rise-time of less than 10 microseconds and a fall time of less than 10 microseconds.

A further object of the currently disclosed embodiments is that at least one magnetic pulse following a first magnetic pulse has a rise-time of less than 10 microseconds and a fall time of less than 10 microseconds.

Another object of the currently disclosed embodiments is that the rise-time of less than 10 microseconds and fall time of less than 10 microseconds are produced using at least one multi-stage high-voltage switch.

Another object of the currently disclosed embodiments is that at least one multi-stage high-voltage switch is used to drive at least one planar coil to generate at least one magnetic pulse.

Another object of the currently disclosed embodiments is the application of magnetic storage materials such as ceramics or ferrites in order to sustain the first magnetic pulse or subsequent magnetic pulses in order to minimize the amount of current through the coil or coils responsible for generating the first or subsequent magnetic pulses.

Another object of the currently disclosed embodiments is the use of at least one multi-stage high-voltage switch in generating at least one magnetic pulse in order to reduce perceived acoustic noise from coils used to create the magnetic pulse.

Another object of the currently disclosed embodiments is the generation of at least one magnetic pulse following a pre-polarizing magnetic pulse uses at least one multi-stage high-voltage switch to drive at least one planar coil.

Another object of the currently disclosed embodiments is the generation of at least one magnetic pulse following a pre-polarizing magnetic pulse that uses at least one multi-stage high-voltage switch to reduce perceived acoustic noise for given magnetic field strengths.

Another object of the currently disclosed embodiments includes the generation of a first magnetic pulse uses at least one multi-stage high-voltage switch enabling shorter magnetic field pulse durations to reduce perceived noise level of MRI by raising the bulk of sound frequencies to a level above the optimal human hearing range.

Another object of the currently disclosed embodiments involves increasing the level of the bulk of generated sound frequencies to above approximately 10 kHz.

Other aspects of the presently disclosed embodiments will be apparent from the discussion that follows.

BRIEF DESCRIPTION OF THE DRAWINGS

The present invention will now be described in connection with one or more drawings, in which.

DETAILED DESCRIPTION

The present invention will now be described in connection with one or more contemplated embodiments. The embodiments discussed are not intended to be limiting of the scope of the present invention. To the contrary, the embodiments described herein are intended to be exemplary of the broad scope of the present invention. In addition, those skilled in the art will appreciate certain variations and equivalents of the embodiments described herein. The present invention is intended to encompass those equivalents and variations as well.

Figure 1:
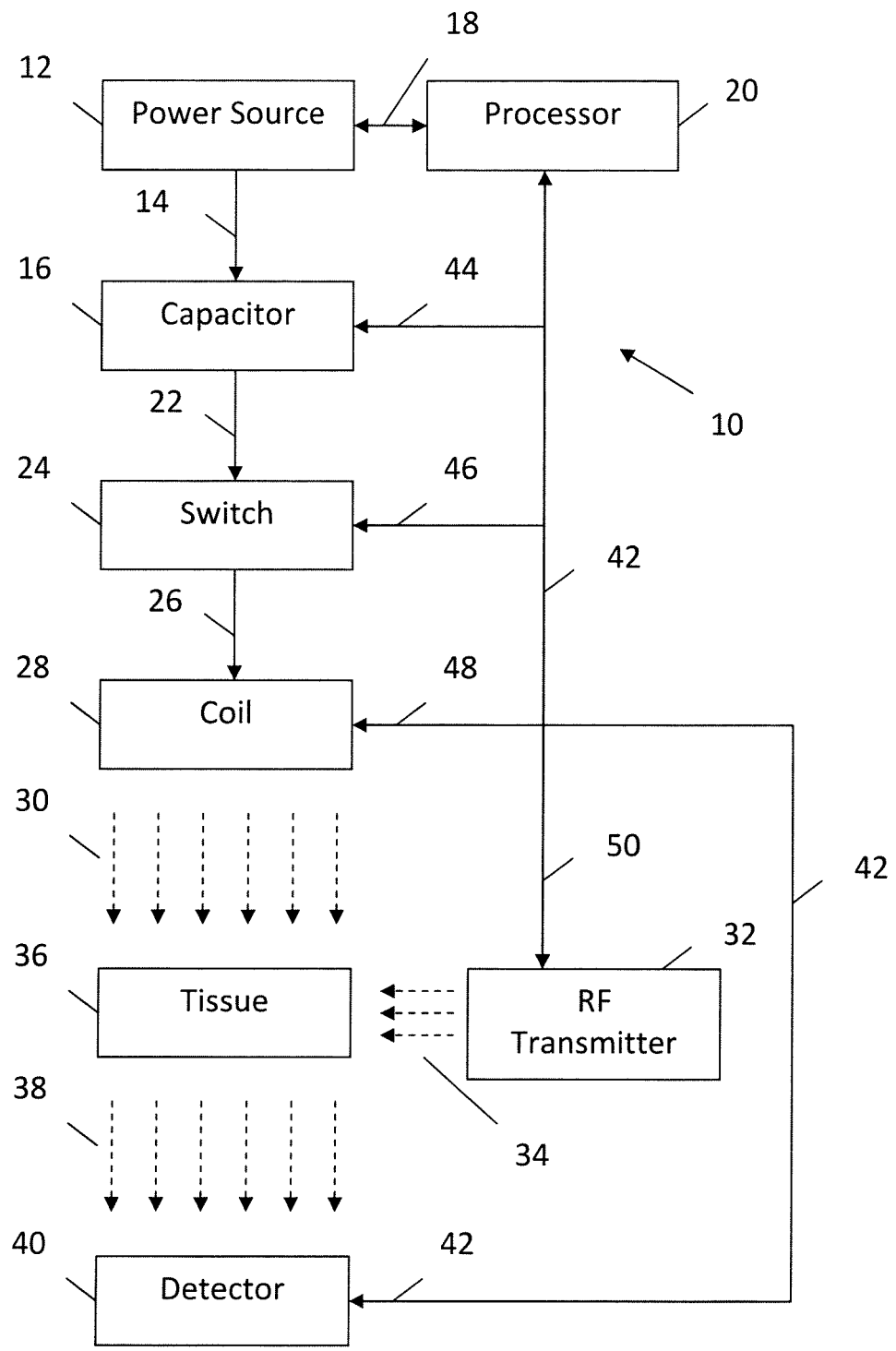
FIG. 1 is a depiction of an apparatus of the present invention.

In FIG. 1, an apparatus for pre-polarized MRI is shown, and has elements corresponding to the IN Weinberg application No. PCT/US2009/047960. With this overview in mind, reference is now made to FIG. 1. FIG. 1 provides a schematic diagram of a first contemplated embodiment of a MRI device 10 according to the present invention.

The MRI device 10 includes a power source 12. The power source 12 may be any type of generator suitable for generating power to be provided to the one or more of the components connected thereto. The generator may provide an alternating current (AC) or a direct current (DC) or both, as should be appreciated by those skilled in the art. The precise output of the power source 12 is not critical to the operation of the present invention. Moreover, the power output of power source 12, once generated, may be converted to different types (e.g., AC or DC) as required by individual components of the system.

In FIG. 1, the power source 12 is illustrated as providing power to each of the various components of the MRI device 10 of the present invention. It is noted, however, that the depicted arrangement is meant to be illustrative only. As should be appreciated by those skilled in the art, the individual components of the MRI device 10 may receive power from a centralized source, such as the power source 12. Alternatively, the various components may receive power from alternative power sources. Accordingly, the depiction of a single power source 12 is not intended to be limiting of the invention.

In addition, as detailed below, the MRI device 10 of the present invention is illustrated and discussed with reference to single communication lines (or links) extending between the various components. The illustration of single communication lines is meant to simplify the discussion and illustration of the various embodiments of the invention. As should be appreciated by those skilled in the art, there may be multiple communication lines between the various components of the MRI device 10 as required for their operation. Moreover, the communication lines are not intended to be limited to wired and optical links. To the contrary, some or all of the communication lines may be wireless, as required or desired for operation of the MRI device 10. The communication lines may also provide power, and may include transformers, rectifiers, switches, and other components in order to boost voltage, provide isolation from voltage spikes, synchronize timing, or perform other electrical functions.

In one contemplated embodiment of the present invention, the power source 12 may include a plurality of power sources 12, each of which generates power with different characteristics, as required by the device(s) and/or components associated therewith.

As depicted in FIG. 1, power from the power source 12 travels in two directions. Power from the power source 12 is conducted first along a communications line 14 to a capacitor 16. Intermediary components along the power line 14, such as a high-voltage transformer and rectifier circuit, are optionally implied in the diagram as described above. Power from the power source 12 is carried second along a communication line 18 to a processor 20.

The capacitor 16 may be of any size or type as would be appreciated by those skilled in the art. As is its nature, the capacitor 16 stores a charge inputted from the power source 12. That charge is eventually discharged (fully or partially), as discussed in greater detail below. It is understood that the term capacitor includes not only the class of discrete components, but also the class of pulse-forming lines, in which the capacitor is combined with a transmission line.

While FIG. 1 illustrates a single capacitor 16, a plurality of capacitors 16 may be employed without departing from the scope of the present invention. In one contemplated embodiment, the MRI device 10 relies upon a plurality of capacitors 16 for its operation. As should be appreciated by those skilled in the art, plural sets of capacitors 16 may be employed to generate one or more magnetic fields and/or gradients. The generated magnetic field may be a polarizing pulse, or may be in the form of a gradient as part of a read-out pulse sequence, or may be a sustained magnetic field that continues during the read-out sequence.

In the second flow path, power from the power source 12 is provided to the processor 20 through communication lines 18. The processor 20 may be of any type suitable for executing instructions, generating data, receiving data, storing data, analyzing data, processing data and the like. In one contemplated embodiment, the processor 12 may be a personal computer. In other embodiments, the processor 12 may be a mainframe computer, a portable computer, a Personal Data Assistant (PDA) or any other similar device. The exact design and functionality of the processor 12 is not critical to operation of the present invention. Accordingly, the processor 12 may be of any type suitable for the operation of the MRI device 10.

The capacitor 16 is connected, via a communication line 22, to a switch, where the term switch refers to one or more high-power solid-state switch modules as previously disclosed in I N Weinberg's application No. PCT/US2009/047960. Accordingly, when the capacitor 16 discharges the stored charge, the stored charge passes through the communication line 22 to the switch 24.

The switch 24 is connected, via a communication line 26, to a coil 28. Accordingly, when the capacitor 16 is discharged, energy from the capacitor 16 is passed to the coil 28, which generates a magnetic field 30.

The coil 28 need not be a single coil. To the contrary, it is contemplated that the coil 28 may include a plurality of coils 28, each of which is capable of generating all or part of the magnetic field 30. Moreover, as should be appreciated by those skilled in the art, where plural coils 28 are employed, the coils 28 need not be of the same type or size. To the contrary, it is contemplated that, where plural coils 28 are employed, they may be differ from one another to produce magnetic field gradients of differing magnitudes, periods, etc. The coil 28 may be a solenoid or other coil that can produce a relatively uniform magnetic field (i.e., not a gradient) for use in pre-polarizing an object or for read-out (in the case of an integrated read-out/gradient coil type (see, for example, Z H Cho and J H Yi, in "A Novel Type of Surface Gradient Coil", published in Journal of Magnetic Resonance 94:471-485 (1991), the subject matter of which is incorporated herein by reference in its entirety)). The coil may be planar, in order to reduce overall size of the system.

As also shown in FIG. 1, the MRI device 10 includes an RF transmitter 32. As discussed briefly above, the Radio Frequency (RF) transmitter 32 generates radio waves 34. While one RF transmitter 32 is illustrated, it is contemplated that a plurality of RF transmitters 32 may be employed without departing from the scope of the present invention. Moreover, where plural RF transmitters 32 are employed, they may be of different sizes, types, etc.

As illustrated, the magnetic field 30 and the RF waves 34 are directed at a tissue sample 36. While the tissue sample 36 may be a portion of an organism, it may also be a complete organism. The sample may alternatively be an inanimate object, such as a rock containing petroleum samples.

During or after interaction of the magnetic field 30 and the RF waves 34 with the tissue 36, the tissue 36 generates a responsive signal 38 that is detected by the detector 40. As should be appreciated by those skilled in the art, the signal 38 may encompass a multitude of different signals from the tissue 36. The detector 40 detects the signals 38 and passes the signals 38 to the processor 20 via the communication line 42. The processor 20 receives and processes the signals 38 to generate an image representative of the composition of the tissue 36. The detector may be a coil as is used in many MRI devices, or may be a magnetometer or Super-conducting QUantum Interference Device (SQUID), as has been advocated for polarized MRI and field-cycling MRI by Espy et al. Alternatively detector 40 need not be a separate component, because MRI device 10 can be configured so that RF transmitter 32 may function (fully or in part) as detector 40.

As should be appreciated by those skilled in the art, the processor 20 may not be the device that processes the signals 38 to generate the image of the tissue 36. To the contrary, the detector 40 may be combined with a suitable imaging device. In still another embodiment, the imager may be a component separate from the processor 20 and the detector 40. Still further embodiments are contemplated to fall within the scope of the present invention.

With continued reference to FIG. 1, the MRI device 10 includes communication line 42. Communication line 42 is illustrated as a central bus that connects the processor 20 to the capacitor via communication line 44, to the switch, via communication line 46, to the coil, via communication line 48, and to the RF transmitter, via communication line 50. A central bus, however, is not required to practice the invention. To the contrary, multiple connections may be established between the components of the MRI device 10 without departing from the scope of the invention, as discussed above.

It is noted that the communication lines 14, 18, 22, 26, 42, 44, 46, 48, 50 all may conduct data and/or power. The communication lines, therefore, are meant to illustrate multimodal connections between the various components of the MRI device 10. As noted above, each of the communication lines 14, 18, 22, 26, 42, 44, 46, 48, 50 may be replaced with one or more separate connections, as required or desired. The communication lines 14, 18, 22, 26, 42, 44, 46, 48, 50 may be unidirectional or bidirectional as required or desired.

With respect to the communication lines 42, 44, 46, 38, 50, it is contemplated that the processor 20 will provide operating instructions to one or more of the components to which it is connected. The processor 20, therefore, is contemplated to incorporate control functionality over one or more of the components, as should be appreciated by those skilled in the art. It is also contemplated that controls may be fed from one component to another, as required or desired for operation of the MRI device 10.

Figure 2:
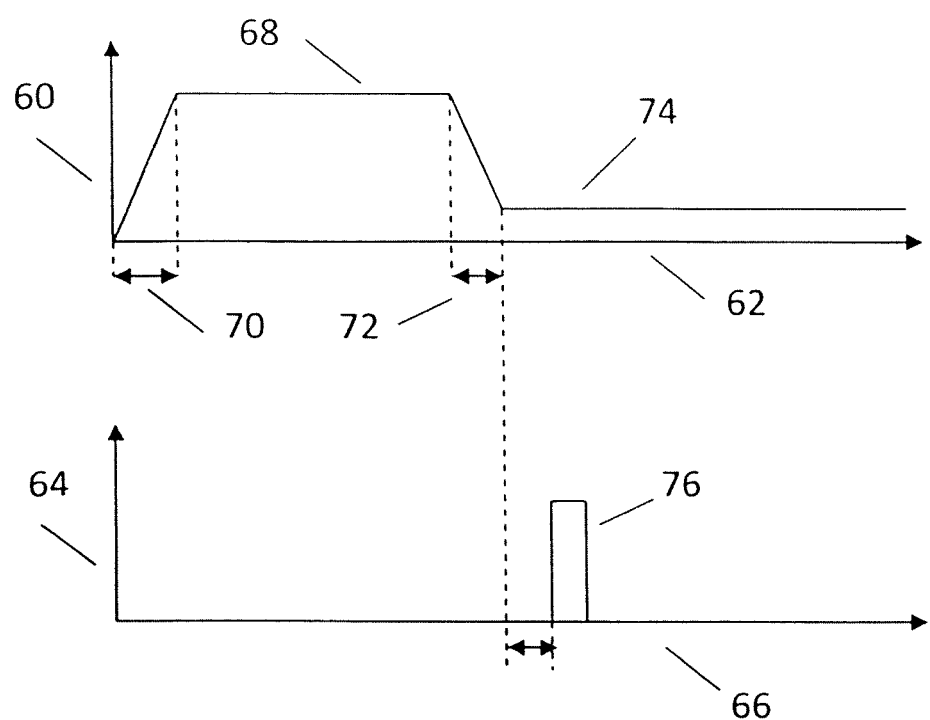
FIG. 2 is an example of a pulse sequence of the invention.

In FIG. 2, an example of the pulse sequence for pre-polarized MRI in accordance with the invention is shown by, for example, P Morgan, S Conolly, G Scott, A Macovski, in "A Readout Magnet for Prepolarized MRI", published in Magnetic Resonance in Medicine 36:527-536 (1996), the subject matter of which is incorporated herein by reference in its entirety. In this figure, ordinate axis 60 represents the pre-polarizing field generated by the circuits, switches, and coils of the invention and ordinate, axis 64, generally represents the magnitudes of a set of pulsed magnetic field gradients and/or radiofrequency pulses which may be generated by the circuits, switches, and coils of the invention. The time evolution of these magnitudes is represented by abscissa axes 62 and 66 respectively. The pre-polarizing pulse 68 is shown with rise-time 70 and fall-time 72, which can be very short according to the invention, so as not to induce bio-effects. After fall-time 72, a reduced magnetic field 74 remains. This field 74 may be generated by the circuits, switches, and coils of the invention, or may be produced by other means, such as a permanent magnet. The pre-polarizing field 68 or the remaining field 74 may occasionally change in order to implement field-cycling. After the fall-time 72, a set of gradient pulses (which may be produced by the circuits and switches of the invention) and/or radiofrequency pulses are applied in order to read-out the spins previously polarized by pulse 68. A representation of the signal acquired by a digitizer is included as 76, again following the publication by P Morgan et al. The signal might be acquired from a tuned coil or from a magnetometer, as in Espy et al.

Figure 3:
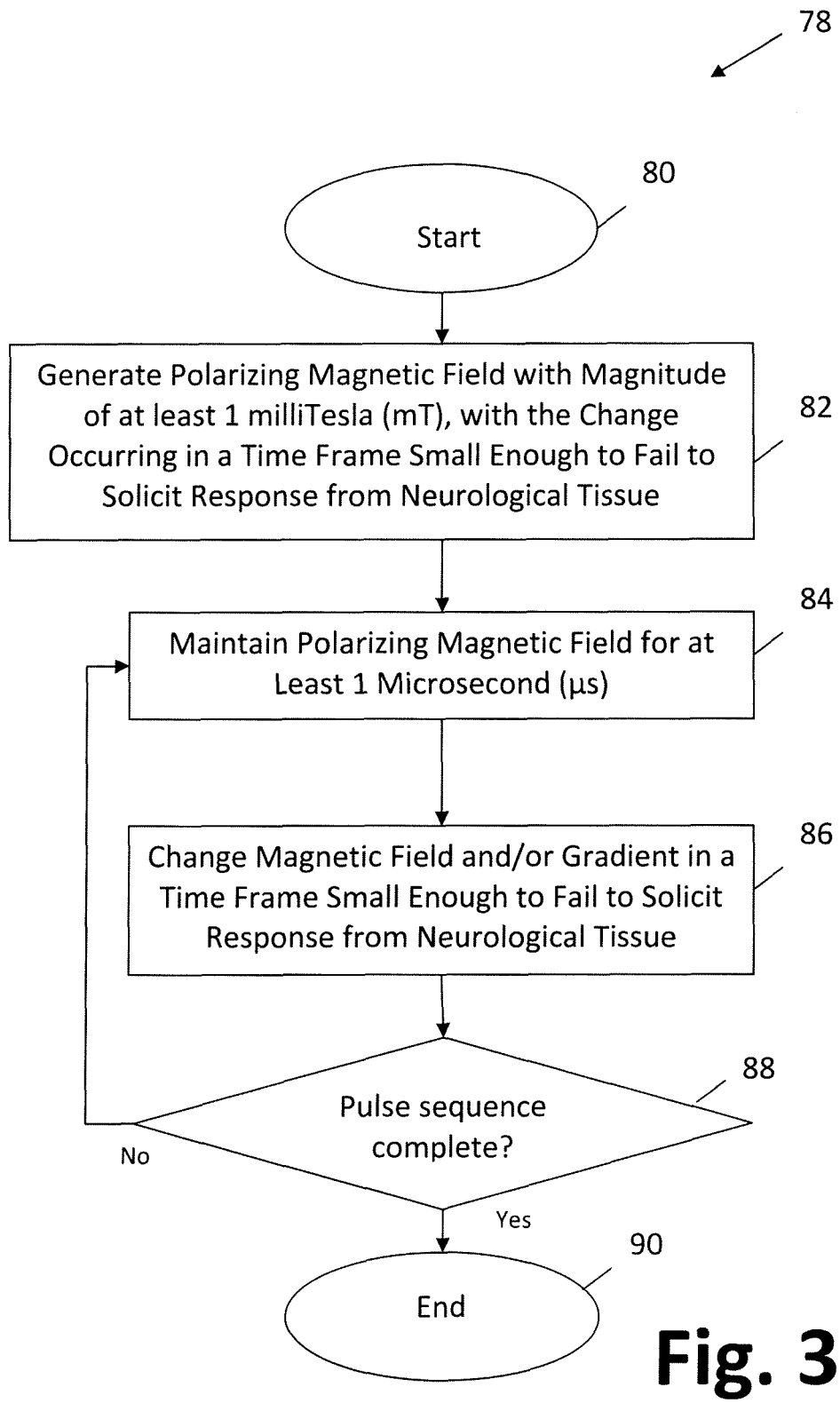
FIG. 3 is a flow chart of operation of the invention.

In FIG. 3, a flow-chart 78 is provided to illustrate the method of operation of the invention for imaging particles such as protons or electrons. The operation begins at 80, after which a polarizing magnetic field is generated at 82 with a magnitude of at least 1 milliTesla by the circuits and/or switches of the invention, and (if used on living beings) with the change occurring in a time frame small enough to fail to solicit a response from neurological tissue. The polarizing magnetic field is sustained for at least one microsecond 84. The polarizing magnetic field is then reduced at 86, again (if used on living beings) with the change occurring in a time frame small enough to fail to solicit a response from neurological tissue. An imaging pulse sequence follows the polarizing magnetic field, said imaging pulse sequence typically involving the application of radiofrequency and magnetic gradient pulses to the tissue.

The magnetic gradients for either the pre-polarizing pulse or for subsequent magnetic gradient pulses that may be generated by the circuits and/or switches of the invention may be repeated according to a decision performed at 88, until such time as the pulse sequence is terminated at 90. Although FIG. 3 describes the pulse sequence as ending at 90, it is understood that the pulse sequence flow-chart of FIG. 3 may be repeated many times with similar or different values of magnetic fields, gradients, and RF pulses in the course of acquiring an image or measurement of a tissue or sample.

Figure 4:
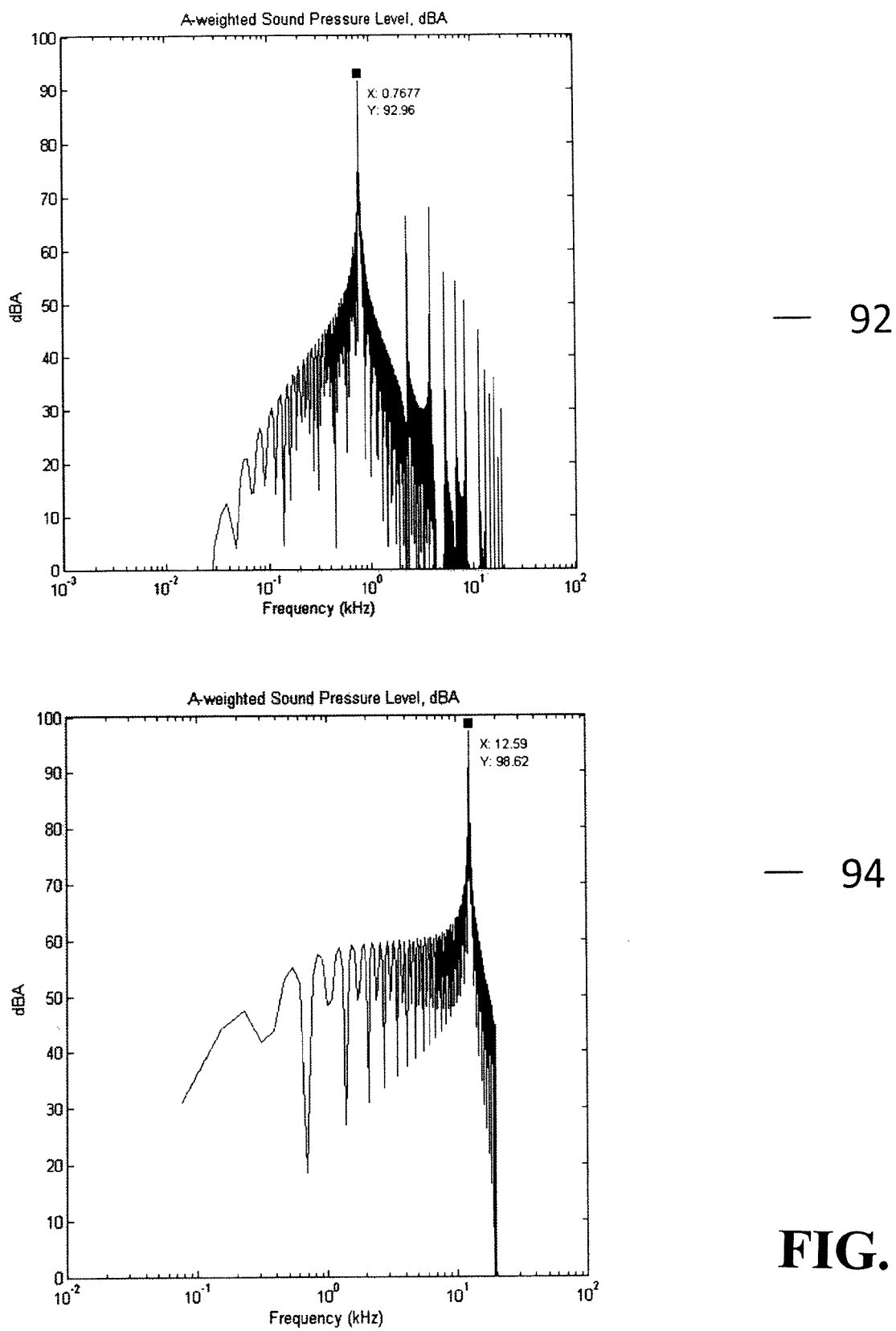
FIG. 4 is an illustration of acoustic noise reduction resulting from the invention.

In FIG. 4, an illustration is provided to show the reduction in acoustic noise expected with the invention. Graph 92 shows the acoustically-weighted frequency spectrum (in dbA) of a conventional MRI pulse sequence, with peak frequency at 767 Hertz. This calculation modeled sound pressure levels for echo-planar sequence at 4 T with standard pulse sequence (slew-rate 200 T/m/s, and maximum gradient strength 40 milliTesla per meter). Graph 94 shows the acoustically-weighted frequency spectrum of an accelerated MRI pulse sequence, taking advantage of the shorter rise- and fall-times available with the circuits and/or switches of the invention, with peak frequency at 12.6 kHz. This second calculation modeled a 14 μs rise/fall time and a gradient maximum of 1,780 milliTeslas per meter, which is a much higher gradient strength than the conventional MRI but results in similar perceived loudness.

The higher gradient fields produced by the disclosed embodiments without soliciting a response from neurological tissue may be used to propel magnetic fluids, where the term magnetic fluids is understood to include collections of magnetic particles. It is understood that the size of the particles, whether micro- or nano-, is included in the term magnetic particles, and that conductive particles impelled with magnetic forces are also included in the class of magnetic particles. By alternating the propulsive pulse sequences with pulse sequences designed to image the magnetic fluids, the invention may be used to guide delivery of the magnetic fluids within tissues.

What is claimed is:

1. A method of magnetic resonance imaging of tissue, the method comprising:
   generating a pre-polarizing magnetic field using at least one coil to polarize particles within the tissue, in which the pre-polarizing field has a rise-time of less than 10 microseconds;
   then conducting a pulse sequence to image the polarized particles, wherein the imaging of the tissue is performed using one or more magnetic fields to produce signal data; and
   reconstructing the signal data to form image data.

2. The method of claim 1, wherein the rise-time of less than 10 microseconds is produced using at least one multi-stage high-voltage switch.

3. The method of claim 1, further comprising storing the image data for analysis.

4. A method of magnetic resonance imaging of tissue, comprising:
   generating a pre-polarizing magnetic field in tissue using at least one coil to polarize the tissue;
   generating a subsequent pulsed magnetic field having at least one of a rise-time of less than 10 microseconds and a fall time of less than 10 microseconds;
   imaging of the tissue using one or more magnetic fields to produce image data; and
   receiving the image data and storing the image data for analysis.

5. The method of claim 4, wherein the subsequent pulsed magnetic field is produced using at least one multi-stage high-voltage switch.

6. The method of claim 5, wherein the subsequent pulsed magnetic field is produced by at least one planar coil.

7. A method of magnetic resonance imaging of tissue, the method comprising:
   generation of a pulsed polarizing magnetic field;
   generating a pulse sequence including at least one pulsed magnetic field having at least one of a rise-time of less than 10 microseconds and a fall time of less than 10 microseconds;
   wherein the pulse sequence is completed within the specific duration of the pulsed polarizing magnetic field,
   wherein at least one of the pulsed magnetic fields is produced by at least one coil;
   imaging of the tissue using one or more magnetic fields to produce signal data; and
   reconstructing the signal data to form image data.

8. The method of claim 7, wherein at least one of the pulsed magnetic fields is produced using at least one multi-stage high-voltage switch.

9. The method of claim 7, further comprising storing the image data for analysis.

10. A method of magnetic resonance imaging of tissue, the method comprising:
    generating at least one pulsed magnetic field using at least one coil, wherein the at least one pulsed magnetic field has at least one of a rise-time of less than 10 microseconds and a fall time of less than 10 microseconds;
    imaging of the tissue using one or more magnetic fields to produce signal data; and
    reconstructing the signal data to form image data,
    wherein the at least one short rise-time and a short fall-time result in perceived acoustic noise for given pulsed magnetic field strengths by raising at least some sound frequencies generated by a coil to a level above the optimal human hearing range.

11. The method of claim 10, wherein the level of at least some of sound frequencies is above about 10 kHz.

12. The method of claim 10, further comprising storing the image data for analysis.

13. A method of magnetic resonance imaging of tissue, the method comprising:
    generating at least one pulsed magnetic field using at least one coil, wherein the at least one pulsed magnetic field has at least one of a rise-time of less than 10 microseconds and a fall time of less than 10 microseconds;
    imaging of the tissue using one or more magnetic fields to produce image data; and
    reconstructing the signal data to form image data,
    wherein the generation of magnetic pulses influences the position of magnetizable or magnetic particles.

14. The method of claim 13, wherein at least one of the pulsed magnetic fields is produced using at least one multi-stage high-voltage switch.

15. The method of claim 13, wherein at least one pulsed magnetic field is used to assess the location of the magnetizable or magnetic particles before or after influencing movement of the particles.

16. The method of claim 13, wherein the magnetizable or magnetic particles are bound to one or more molecules with biochemical binding specificity.

17. The method of claim 13, wherein the magnetizable or magnetic particles are bound to one or more molecules with therapeutic efficacy.

18. The method of claim 13, further comprising storing the image data for analysis.

19. A method of imaging tissue, the method comprising:
    applying at least one pulsed magnetic field to a tissue sample to affect magnetization of particles within the tissue, wherein the at least one applied pulsed magnetic field has a rise-time of less than 10 microseconds;
    subsequently applying a sequence of at least one electromagnetic and/or pure magnetic pulses that alter an affected magnetization state of the tissue in time and/or space;
    receiving signals from the tissue, the signals indicating a time-evolution of the magnetization state of the tissue; and analyzing the signals to collect spatially-variant information relating to the tissue, the information comprising an image of the tissue.

20. The method of claim 19, wherein the at least one pulsed magnetic field is produced using at least one multi-stage high-voltage switch.

21. The method of claim 19, wherein the at least one pulsed magnetic field is applied to the tissue using a planar electromagnetic coil.

22. The method of claim 19, wherein the affected magnetization of particles within the tissue contributes to forces that lead to spatial displacement of the particles within the tissue.

23. The method of claim 19, wherein the particles within the tissue are bound to one or more molecules with biochemical binding specificity.

24. The method of claim 19, wherein the particles within the tissue are bound to one or more molecules with therapeutic efficacy.

* * * * *